United States Patent [19]

Camlibel et al.

[11] Patent Number: 4,634,474
[45] Date of Patent: Jan. 6, 1987

[54] COATING OF III-V AND II-VI COMPOUND SEMICONDUCTORS

[75] Inventors: Irfan Camlibel, Stirling; Aland K. Chin, Berkeley Heights; Shobha Singh, Summit; LeGrand G. Van Uitert, Morris Township, Morris County; George J. Zydzik, Columbia, all of N.J.

[73] Assignee: AT&T Bell Laboratories, Murray Hill, N.J.

[21] Appl. No.: 658,569

[22] Filed: Oct. 9, 1984

[51] Int. Cl.⁴ .................. H01L 21/223; H01L 21/383
[52] U.S. Cl. .................................. 148/1.5; 148/187; 148/189; 148/191
[58] Field of Search ............... 148/1.5, 191, 187, 174, 148/189

[56]  References Cited

U.S. PATENT DOCUMENTS

| | | | |
|---|---|---|---|
| 3,755,016 | 8/1973 | Russ et al. | 148/DIG. 64 |
| 3,890,169 | 6/1975 | Schwartz et al. | 148/1.5 X |
| 3,925,121 | 12/1975 | Touchy | 148/191 X |
| 4,062,707 | 12/1977 | Mochizuki et al. | 148/187 |
| 4,089,714 | 5/1978 | Johnson et al. | 148/1.5 X |
| 4,105,472 | 8/1978 | Lancaster | 148/1.5 |
| 4,172,906 | 10/1979 | Pancholy | 148/1.5 X |
| 4,194,934 | 3/1980 | Blaske et al. | 148/174 |
| 4,218,271 | 8/1980 | Wood | 148/174 X |
| 4,396,437 | 8/1983 | Kwok et al. | 148/1.5 |
| 4,396,443 | 8/1983 | Lewerenz et al. | 148/1.5 X |
| 4,493,142 | 1/1985 | Hwang | 148/1.5 X |
| 4,494,997 | 1/1985 | Lemnios et al. | 148/1.5 |
| 4,501,625 | 2/1985 | Tregilgas et al. | 148/1.5 X |

FOREIGN PATENT DOCUMENTS 103122 6/1983 Japan.
1053046 12/1966 United Kingdom.

OTHER PUBLICATIONS

Ghandhi, Sorabki, VLSI Fabrication Principles Silicon and Gallium Arsenide, John Wiley & Sons, N.Y., 1983.
"The Diffusion of Silicon in Gallium Arsenide", Solid-State Electronics, G. R. Antell, vol. 8, 1965, pp. 943–946.
"Diffusion of Silicon in Gallium Arsenide Using Rapid Thermal Processing: Experiment and Model," Applied Physics Letters, M. E. Greiner et al., vol. 44, (8), Apr. 1984, pp. 750–752.

Primary Examiner—George T. Ozaki
Attorney, Agent, or Firm—Lester H. Birnbaum

[57]  ABSTRACT

Proposed is a method of fabricating III-V and II-VI compound semiconductors and a resulting product where there is formed on the surface a coating which can function as a diffusion mask and/or a passivation layer. The coating is a silicon layer deposited by a method which does not damage the semiconductor surface.

8 Claims, 4 Drawing Figures

COATING OF III-V AND II-VI COMPOUND SEMICONDUCTORS

BACKGROUND OF THE INVENTION

This invention relates to the fabrication of III-V and II-VI compound semiconductor devices and, in particular, to the formation of desirable coatings on the surface of said devices.

The use of III-V and II-VI compound semiconductors to form devices such as light emitting diodes (LEDs), lasers, and photodiodes is continuing to expand. One of the critical steps in the fabrication of such devices is the formation of localized p-n junctions and ohmic contacts by diffusion of material into the semiconductor surface. Such diffusions require a mask which does not interact with the semiconductor, which is impermeable to the diffusing species and which remains intact at high temperatures. In some processing, it is also important to anneal the devices at high temperature. During such an annealing, the device is usually encapsulated with a coating to avoid thermal decomposition of the semiconductor. This coating must also remain intact and not interact with the semiconductor even at high temperatures.

In the fabrication of III-V and II-VI compound devices, silicon dioxide or silicon nitride is typically used as a diffusion mask or encapsulation coating. While generally adequate, use of such layers produces problems in reproducibility since the stoichiometry and physical properties of these films can vary depending on deposition conditions. Further, the thermal coefficient of expansion of these films differs greatly from that of the semiconductor, thereby causing stresses which can crack the coating during thermal treatments and can cause undesired lateral diffusion of the impurity in the semiconductor surface.

It is therefore an object of the invention to provide a coating for III-V and II-VI compound semiconductors, which coating is highly reproducible and has a close thermal expansion match with the semiconductor.

SUMMARY OF THE INVENTION

This and other objects are achieved in accordance with the invention which in one aspect is a method for fabricating III-V and II-VI compound semiconductor devices. A layer of silicon is formed on the surface of the semiconductor in a manner which does not cause significant damage to the surface. The structure is subsequently heated to a temperature of at least 400 degrees C. without causing significant diffusion of the silicon layer into the surface of the semiconductor.

In accordance with another aspect, the invention is a device comprising a semiconductor material selected from the group consisting of III-V and II-VI compounds. On at least a portion of a major surface of the semiconductor is a layer comprising silicon.

BRIEF DESCRIPTION OF THE DRAWING

These and other features of the invention are delineated in detail in the following description. In the drawing.

Figure 1:
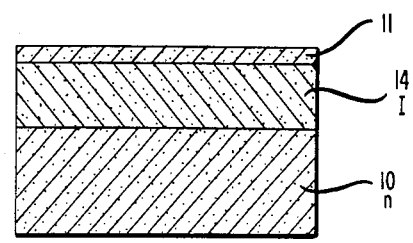
FIGS. 1-4 are cross-sectional views of a device in various stages of fabrication in accordance with one embodiment of the invention.

It should be appreciated that for purposes of illustration these Figures are not necessarily drawn to scale.

DETAILED DESCRIPTION

One embodiment of the invention is illustrated in the sequence of steps shown in FIGS. 1-4 used for a typical device fabrication. The starting material is usually a substrate, 10, of a III-V or II-VI semiconductor material. In this example, the material has n-type InP with an impurity concentration of approximately $5 \times 10^{16}$ cm.$^{-3}$. Formed on the substrate was an undoped epitaxial layer, 14, comprising InGaAs with a thickness of approximately 4 $\mu$m. (The epitaxial layer is considered to be part of the substrate and no distinction between the two will be made herein.)

On one major surface of the substrate a layer, 11, comprising undoped silicon is deposited. It is important that the deposition process not produce any significant damage to the substrate surface. If the layer were sputtered on, for example, the silicon layer would have a tendency to diffuse into the substrate during subsequent heat treatments. (See, for example, Antell, "The Diffusion of Silicon in Gallium Arsenide," *Solid State Electronics*, Vol. 8, pp. 943-946 (1965).) We have found, however, that if the layer is deposited by a process which does not damage the surface, the silicon layer will not diffuse into the semiconductor to any significant degree and can therefore be used as an effective diffusion mask and/or encapsulation coating. In this example, the layer was deposited by a standard electron-beam evaporation technique where the substrate was placed in a vacuum chamber along with a source of silicon and the source was bombarded by an electron beam while the substrate was held at a temperature of approximately 150 degrees C. Other methods which could be used include thermal evaporation and chemical vapor deposition. The thickness of the layer in this example was approximately 3,000 Angstroms, although it is expected that layer thicknesses in the range 100-10,000 Angstroms should provide useful coatings. The resistivity of the undoped silicon in this example was 6000 $\Omega$-cm.

It is preferred that the silicon layer be undoped (carrier concentration $|N_D - N_A| < 10^{15}$ cm$^{-3}$) so that it can be assured of uniform properties after each deposition and to provide a high resistivity (at least 4 $\Omega$-cm.). Furthermore, the purer the film, the lower will be the electrical leakage through the film during device operation. For some types of devices, however, the less pure silicon layer may be economically desirable if the devices can withstand some electrical leakage through the layer. Deposition should also take place at a sufficiently low temperature to insure that the semiconductor substrate is not thermally damaged, otherwise reproducibility problems such as experienced in prior art processes may be encountered. Consequently, a useful temperature range for deposition is approximately 25-200 degrees C. for II-VI semiconductor substrates and approximately 25-400 degrees C. for III-V semiconductor substrates. The layer apparently can be amorphous or polycrystalline. At the temperature employed in this example, it could be characterized as either since it contains some crystalline order and the boundary between "amorphous" and "crystalline" is not clearly drawn in the art.

The deposited layer has a thermal coefficient of expansion of approximately $4 \times 10^{-6}$ per degrees C. which reasonably matches that of the III-V and II-VI semiconductors. In general, it is desirable that the coefficients of expansion of the layer and semiconductor differ by no more than $5 \times 10^{-6}$ per degrees C. and preferably by no more than $2 \times 10^{-6}$ per degrees C.

Figure 2:
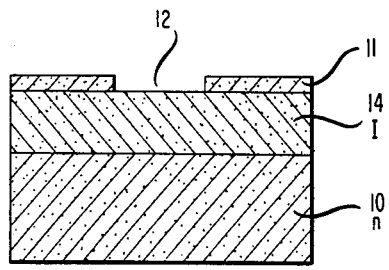

As shown in FIG. 2, a window 12 was opened in the silicon layer by means of standard photolithographic etching techniques. The photoresist layer (not shown) was positive photoresist manufactured by Shipley (Product No. AZ1350) which was developed to form circular openings approximately 75 μm in diameter. The exposed silicon was etched using a freon plasma, but other standard etching techniques might be employed.

Figure 3:
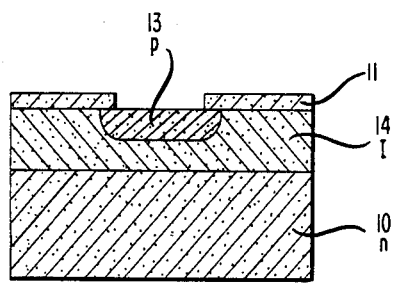

As illustrated in FIG. 3, the structure was subsequently subjected to a diffusion process utilizing the silicon layer as a mask in order to form a localized p-type region, 13, in the exposed surface of the semiconductor substrate. The diffusion was carried out in a sealed ampoule utilizing Zn as the diffusant at a temperature of approximately 550 degrees C. for approximately 30 minutes. This produced a junction depth of approximately 2 μm. Of course, other p-type or n-type diffusants can be employed. In general, diffusion will be done at temperatures of 200–600 degrees C. for II-VI semiconductor substrates and 400–1,000 degrees C. for III-V semiconductor substrates for a period of time within the range 1 min.–100 hrs. Some diffusion operations may require temperatures of at least 900 degrees C. It is desirable that no significant amount of SiO$_2$ be formed on the semiconductor surface. This can be prevented either by diffusing in a sealed ampoule as in the present example, or diffusing in a relatively oxygen-free ambient. The fact that the silicon layer had not been converted was shown by the fact that the layer was impervious to HF, which would normally etch an SiO$_2$ layer.

Cleaving and staining the wafer revealed no undue lateral diffusion of the impurity, which would have occurred if there had been excess stresses between the silicon layer and semiconductor substrate. Further, low leakage currents (less than 20 nA. at 10 V reverse bias), comparable to those obtained using silicon nitride as a diffusion mask, were observed. Surprisingly, though silicon is often used as a dopant impurity in semiconductors, it was found that no significant diffusion of the silicon into the semiconductor had occurred. This is believed due to the lack of stress effects at the surface normally caused by the deposition of the silicon or by overlying the silicon with another layer. (See Greiner et al, "Diffusion of Silicon in Gallium Arsenide Using Rapid Thermal Processing," *Applied Physics Letters*, Vol. 44, pp. 750–752 (Apr. 15, 1984).) This lack of diffusion in the present example was shown by removing the silicon layer with a freon plasma. An Auger analysis revealed no trace of silicon on the surface of the semiconductor once the layer was removed.

Figure 4:
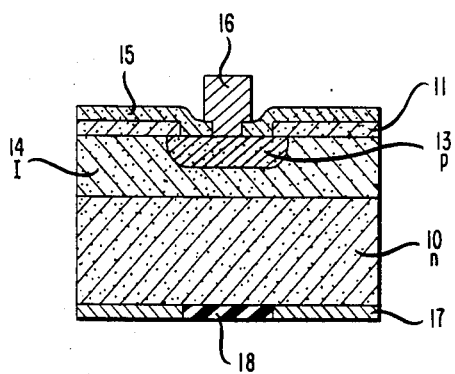

In the final stages of fabrication, as illustrated in FIG. 4, a second layer of silicon, 15, which was identical to the first layer, 11, was deposited over the first layer and a window opened over the p-region 13 by standard photolithography. Ohmic contact to the p-region was provided by depositing a Cr-Au alloy metal 16 over the window. Similarly, ohmic contact to the n-region was provided by a layer, 17, of Cr-Au. In the latter contact, a window was provided for the entrance of light and into this window an antireflection coating, 18, typically comprising silicon nitride, was deposited. It will be noted in this example that the silicon layer, 11, remains on the surface of the device to provide electrical insulation in place of standard SiO$_2$ and Si$_3$N$_4$ layers. If desired, the silicon layer, 11, can be removed by a suitable etchant subsequent to the diffusion operation.

If desired, the silicon layer can also be utilized as an encapsulation coating to prevent out-diffusion of the semiconductor components during annealing operations. This was confirmed by electron-beam evaporating a 3,000 Angstroms thick silicon layer onto a Mn-doped InP substrate with an impurity concentration of approximately $10^{16}$ cm.$^{-3}$. The structure was annealed in nitrogen at 900 degrees C. for 60 seconds. No cracking of the layer was observed. After removal of the layer, Auger analysis again demonstrated that no significant amount of silicon remained on the semiconductor surface. Furthermore, the semiconductor surface remained p-type thus indicating that silicon, which is a donor in InP, had not diffused into the semiconductor in any significant amount (i.e., the concentration of Si must have been less than $10^{16}$ cm.$^{-3}$). Typical annealing cycles, which the silicon layer should withstand, are the same ranges given previously for diffusion processes.

It will be appreciated that the inventive method may be employed for fabricating a wide variety of III-V and II-VI semiconductor devices requiring a diffusion and/or an annealing step such as heterostructure lasers and LEDs. In some situations, it may be desirable to etch the silicon layer only partially through to form the opening for diffusion. The silicon layer can also be used as a mask in ion implantation processes.

Other III-V semiconductor substrates which might be included with the invention include GaAs and AlGaAs. Some II-VI semiconductor substrates are HgCdTe, CdTe, PbTe and PbSnTe.

It will be understood in the attached claims that the term "devices" is intended to include integrated circuits as well as discrete devices.

Various additional modifications of the invention will become apparent to those skilled in the art. All such variations which basically rely on the teachings through which the invention has advanced the art are properly considered within the spirit and scope of the invention.

What is claimed is:

1. A method for fabricating III-V and II-VI compound semiconductor devices comprising the steps of forming a layer comprising silicon on a major surface of a semiconductor substrate comprising a material selected from the group consisting of III-V and II-VI compounds in a manner which does not cause significant damage to the semiconductor surface and subsequently heating the structure without causing significant diffusion of the silicon layer into the surface of the semiconductor and without converting any significant amount of the silicon layer to silicon oxide.

2. The method according to claim 1 wherein an opening is formed in the silicon layer and impurities are introduced into the semiconductor through the opening while the silicon layer acts as a mask.

3. The method according to claim 2 wherein the structure is heated to a temperature within the range 200–1,000 degrees C. for a time within the range 1 min.–100 hrs.

4. The method according to claim 1 wherein the thickness of the layer is within the range 100–10,000 Angstroms.

5. The method according to claim 1 wherein the layer is deposited by electron-beam evaporation.

6. The method according to claim 1 wherein the structure is heated to a temperature within the range 200–1,000 degrees C. for a time of 1 min.–100 hrs. in order to anneal the semiconductor while the silicon layer prevents out-diffusion of the semiconductor components.

7. The method according to claim 1 wherein the layer consists essentially of undoped silicon.

8. A method of fabricating III-V and II-VI compound semiconductor devices comprising the steps of:

forming a layer consisting essentially of undoped silicon on a major surface of a semiconductor substrate comprising a material selected from the group consisting of III-V and II-VI compounds;

forming an opening in said layer;

diffusing an impurity into the portion of the semiconductor exposed by said opening by heating the structure to a temperature within the range 200–1,000 degrees C. for a time of 1 min.–100 hrs. while no significant amount of the silicon diffuses into the semiconductor and no significant amount of the silicon layer is converted to silicon dioxide.

* * * * *